United States Patent
Hessler et al.

(10) Patent No.: US 10,310,451 B2
(45) Date of Patent: Jun. 4, 2019

(54) CERAMIC TEMPERATURE-COMPENSATED RESONATOR

(71) Applicant: The Swatch Group Research and Development Ltd, Marin (CH)

(72) Inventors: Thierry Hessler, St-Aubin (CH); Philippe Dubois, Marin (CH); Thierry Conus, Lengnau (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 14/355,945

(22) PCT Filed: Oct. 11, 2012

(86) PCT No.: PCT/EP2012/070129
§ 371 (c)(1),
(2) Date: May 2, 2014

(87) PCT Pub. No.: WO2013/064351
PCT Pub. Date: May 10, 2013

(65) Prior Publication Data
US 2014/0313866 A1    Oct. 23, 2014

(30) Foreign Application Priority Data
Nov. 4, 2011 (EP) ..................... 11187854

(51) Int. Cl.
*H03H 3/02* (2006.01)
*H03H 9/02* (2006.01)
(Continued)

(52) U.S. Cl.
CPC ............ *G04B 17/22* (2013.01); *G04B 17/227* (2013.01); *G04B 17/24* (2013.01); *H03H 3/0076* (2013.01);
(Continued)

(58) Field of Classification Search
CPC ...... G04B 17/222; G04B 17/22; G04B 17/00; G04B 17/045; G04B 17/066; G04B 17/24; H01L 41/04
(Continued)

(56) References Cited

U.S. PATENT DOCUMENTS

| | | | | |
|---|---|---|---|---|
| 4,456,898 A | * | 6/1984 | Frischmann | ............ H01F 1/153 335/208 |
| 6,213,635 B1 | * | 4/2001 | Savy et al. | ..................... 368/299 |

(Continued)

FOREIGN PATENT DOCUMENTS

| | | | |
|---|---|---|---|
| EP | 1 422 436 | 5/2004 | |
| EP | 2320281 A2 * | 5/2011 | ........... G04B 17/063 |

(Continued)

OTHER PUBLICATIONS

Metglas FAQ, Jun. 10, 2011, full document, retrieved on Jul. 1, 2016 from <http://www.metglas.com/faq/?faq_id=21>.*
(Continued)

*Primary Examiner* — Amy Cohen Johnson
*Assistant Examiner* — Daniel P Wicklund
(74) *Attorney, Agent, or Firm* — Oblon, McClelland, Maier & Neustadt, L.L.P.

(57) ABSTRACT

A temperature-compensated resonator including a body used in deformation, and a core of the body is formed by a material that is one of glass, ceramic glass, technical ceramic, and metallic glass. At least one part of the body includes a coating whose Young's modulus variation with temperature is of an opposite sign to that of the material used for the core, so that at least a first order frequency variation with temperature of the resonator is substantially zero.

41 Claims, 2 Drawing Sheets

(51) Int. Cl.
*H03H 9/24* (2006.01)
*G04B 17/22* (2006.01)
*G04B 17/24* (2006.01)
*H03H 3/007* (2006.01)

(52) U.S. Cl.
CPC ...... *H03H 9/02448* (2013.01); *H03H 9/2468* (2013.01); *H03H 2003/027* (2013.01)

(58) Field of Classification Search
USPC ........................................ 368/171, 175, 182
See application file for complete search history.

(56) References Cited

U.S. PATENT DOCUMENTS

| | | | |
|---|---|---|---|
| 7,758,237 B2 * | 7/2010 | Musy et al. .................. | 368/177 |
| 8,641,023 B2 * | 2/2014 | Charbon ................ | F16F 1/024 |
| | | | 267/180 |
| 8,724,431 B2 * | 5/2014 | Hessler ................... | G04F 5/063 |
| | | | 310/346 |
| 2005/0195050 A1 * | 9/2005 | Lutz et al. .................... | 333/186 |
| 2005/0281137 A1 * | 12/2005 | Bourgeois ............... | F16F 1/021 |
| | | | 368/175 |
| 2007/0140065 A1 * | 6/2007 | Levingston ................... | 368/127 |
| 2008/0008050 A1 * | 1/2008 | Bourgeois ..................... | 368/127 |
| 2009/0016173 A1 * | 1/2009 | Hessler ................... | C03C 15/00 |
| | | | 368/140 |
| 2009/0115294 A1 * | 5/2009 | Kikushima ................... | 310/370 |
| 2009/0121808 A1 * | 5/2009 | Van Beek et al. ............. | 333/186 |
| 2009/0303842 A1 * | 12/2009 | Gritti ..................... | G04B 1/145 |
| | | | 368/140 |
| 2010/0013360 A1 | 1/2010 | Baborowski et al. | |
| 2010/0290320 A1 | 11/2010 | Gygax et al. | |
| 2010/0301958 A1 * | 12/2010 | Kawashima .................. | 331/163 |
| 2011/0037537 A1 * | 2/2011 | Cusin et al. .................. | 333/186 |
| 2011/0115342 A1 * | 5/2011 | Yang et al. .................... | 310/365 |
| 2011/0266917 A1 * | 11/2011 | Metzger ................... | H03H 3/02 |
| | | | 310/313 A |
| 2011/0305120 A1 * | 12/2011 | Hessler et al. ................ | 368/159 |
| 2012/0230159 A1 * | 9/2012 | Hessler ................ | G04B 17/227 |
| | | | 368/160 |

FOREIGN PATENT DOCUMENTS

| | | | | |
|---|---|---|---|---|
| EP | 2337221 A1 * | 6/2011 | .......... | G04B 17/227 |
| WO | 2008 043727 | 4/2008 | | |
| WO | 2009 068091 | 6/2009 | | |
| WO | 2011 072960 | 6/2011 | | |

OTHER PUBLICATIONS

Dubois, Marc-Alexandre, English Translation of EP 2320281, originally published May 11, 2011, full document.*
International Search Report dated Jan. 11, 2013 in PCT/EP12/070129 Filed Oct. 11, 2012.

* cited by examiner

CERAMIC TEMPERATURE-COMPENSATED RESONATOR

CROSS-REFERENCE TO RELATED APPLICATIONS

This is a National phase application in the United States of International patent application PCT/EP2012/070129 filed Oct. 11, 2012 which claims priority on European patent application No. 11187854.2 filed Nov. 4, 2011. The entire disclosures of the above patent applications are hereby incorporated by reference.

FIELD OF THE INVENTION

The invention relates to a temperature-compensated resonator of the sprung balance, tuning fork or more generally MEMS type for manufacturing a time or frequency base whose first, and eventually second, orders thermal coefficients are substantially zero.

BACKGROUND OF THE INVENTION

EP Patent No. 1 422 436 discloses a balance spring formed of silicon and coated with silicon dioxide so as to make the thermal coefficient substantially zero around COSC (Swiss Official Chronometer Testing Institute) certification process temperatures, i.e. between +8 and +38° C. Likewise, WO Patent No. 2008-043727 discloses a MEMS resonator which has similar properties of low variation from its Young's modulus within the same temperature range.

However, the frequency variation in the above disclosures can require complex corrections depending upon the application. For example, for electronic quartz watches to be able to be COSC certified, an electronic correction has to be carried out based on a temperature measurement.

SUMMARY OF THE INVENTION

It is an object of the present invention to overcome all or part of the aforementioned drawbacks, by providing an at least first order temperature-compensated ceramic resonator.

The invention therefore relates to a temperature-compensated resonator including a body used in deformation, the core of the body being formed of ceramic, characterized in that at least one part of the body has at least one coating whose Young's modulus variation with temperature is of the opposite sign to that of the ceramic used for the core, so that at least the first order frequency variation with temperature of said resonator is substantially zero.

Advantageously according to the invention, the resonator body used in deformation may include a single coating to compensate one or two orders. Thus, depending upon the size and sign of each order of the coating material, the thickness of the coating is calculated so as to compensate at least the first order.

In accordance with other advantageous features of the invention:
- the core body includes glass, metallic glass, technical ceramic or ceramic glass;
- the body includes a substantially quadrilateral-shaped section whose faces are in identical pairs;
- the body includes a substantially quadrilateral-shaped section whose faces are entirely coated;
- said at least one coating forms a barrier against moisture;
- said at least one coating is electrically conductive;
- the body includes a primer layer between the core and said at least one coating;
- the body is a bar wound around itself to form a balance spring and is coupled with an inertia fly-wheel;
- the body includes at least two symmetrically mounted bars forming a tuning fork;
- the body is a MEMS resonator.

Finally, the invention also relates to a time or frequency base, such as, for example a timepiece, characterized in that it includes at least one resonator according to any of the preceding variants.

BRIEF DESCRIPTION OF THE DRAWINGS

Other features and advantages will appear clearly from the following description, given by way of non-limiting illustration, with reference to the annexed drawings, in which.

DETAILED DESCRIPTION OF PREFERRED EMBODIMENTS

Figure 4:
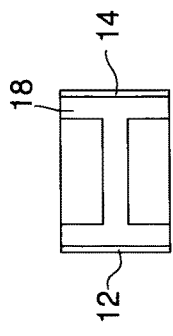
FIGS. 3 and 4 are alternative sections of a resonator according to the invention.

As explained above, the invention relates to a timepiece including a resonator which may be of the sprung balance or tuning fork or, more generally, MEMS (Micro-Electro-Mechanical System) type. To simplify explanation of the invention, the only applications presented below are to a sprung balance and a tuning fork. However, those skilled in the art could achieve other applications for the resonator without any difficulty from the teaching below.

By way of definition, the relative frequency variation of a resonator follows the relationship below:

$$\frac{\Delta f}{f_0} = A + \alpha \cdot (T - T_0) + \beta \cdot (T - T_0)^2 + \gamma \cdot (T - T_0)^3$$

where:

$$\frac{\Delta f}{f_0}$$

is the relative frequency variation (ppm or $10^{-6}$);
A is a constant which depends upon the point of reference (ppm);
$T_0$ is the reference temperature (° C.);
$\alpha$ is the first order thermal coefficient (ppm. ° C.$^{-1}$);
$\beta$ is the second order thermal coefficient (ppm. ° C.$^{-2}$);
$\gamma$ is the third order thermal coefficient (ppm. ° C.$^{-3}$).

Moreover, the thermal elastic coefficient (TEC) represents the relative Young's modulus variation with temperature. The terms "$\alpha$" and "$\beta$" which are used below thus respectively represent the first and second order thermal coefficients, i.e. the relative frequency variation of the resonator according to temperature. The terms "$\alpha$" and "$\beta$" depend upon the thermal elastic coefficient of the resonator body and the expansion coefficients of the body. Moreover, the terms "α" and "β" also take into account the coefficients peculiar to any separate inertia block, such as, for example, the balance (forming an inertia fly-wheel) for a sprung-balance resonator.

As the oscillations of any resonator intended for a time or frequency base have to be maintained, thermal dependence may also include a contribution from the maintenance system.

The most important parameter is therefore the thermal elastic coefficient (TEC) which should not be confused with the "CTE", i.e. the constant of thermal expansion which concerns the expansion coefficient.

The thermal elastic coefficient (TEC) of most metals is very negative, on the order of −1000 ppm. ° $C.^{-1}$. It is therefore impossible to envisage using them to form a balance spring. Complex alloys have thus been developed, such as Nivarox CT(Non-Variable Non-Oxidizing nickel iron alloy), to respond to this problem. However, they remain difficult to deal with particularly as regards their manufacture.

Advantageously, the invention relates to alternative ceramic materials for forming said resonators. A ceramic may be considered to be an article having a vitrified or non-vitrified body, a crystalline or partially crystalline structure, or made of glass, whose body is formed of essentially inorganic and metallic or non-metallic substances, and which is formed by a molten mass which solidifies on cooling, or which is formed and brought to maturity, at the same time or subsequently, by the action of heat.

A ceramic according to the invention thus encompasses simple glasses, metallic glasses, technical ceramics such as silicon carbide, or ceramic glasses. Thus, advantageously according to the invention, the ceramic resonator may have at least one coating whose Young's modulus variation with temperature is of the opposite sign to that of the ceramic used for the core, so that at least the first order frequency variation with temperature of said resonator is substantially zero.

It is also advantageous for the coating to be electrically conductive to prevent the movement of the body from generating electrostatic forces capable of affecting the trajectory of the body. Finally, it is also preferable for the coating to offer permeability capable of forming a barrier against moisture, such as, for example, silicon nitride.

Figure 2:
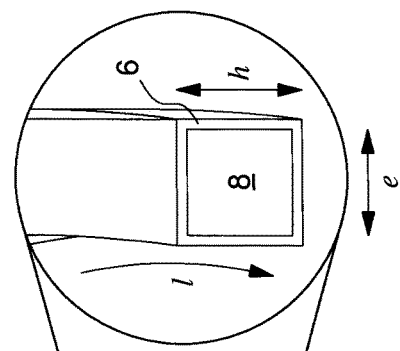
FIG. 2 is a representative section of the balance spring of FIG. 1.
Figure 1:
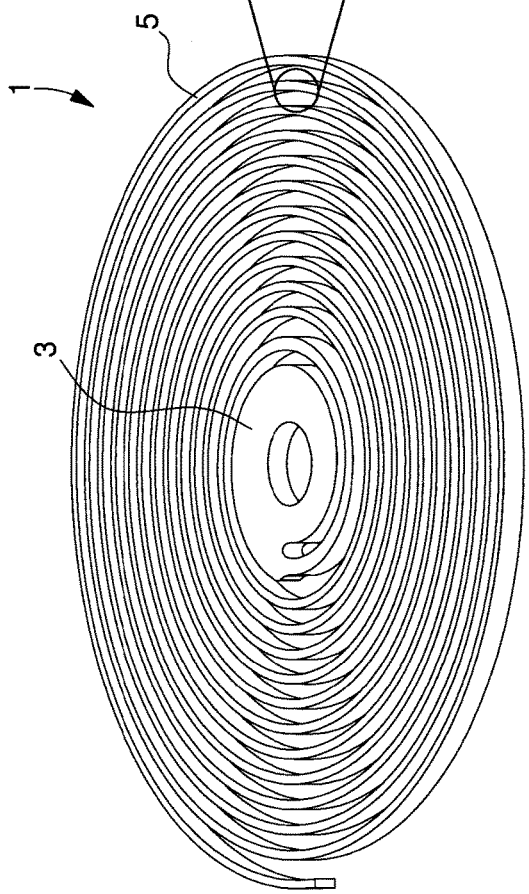
FIG. 1 is a perspective view of one part of a sprung balance resonator.

In an example illustrated in FIGS. 1 and 2, a balance spring 1 can be seen whose body 5 is integral with its collet 3 and whose first α or second β order thermal coefficients are compensated by the use of two materials for core 8 and coating 6 respectively. FIG. 2 proposes a cross-section of body 5 of balance spring 1 more clearly showing its quadrilateral-shaped section. Body 5 can thus be defined by the length l, height h and thickness e thereof.

Figure 3:
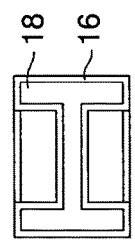

FIG. 2 shows an example wherein core 8 is entirely coated. Of course, FIG. 2 merely shows a non-limiting example. Thus, balance spring 1 may include a coating 2, 4, 6 on at least one part such as one or more faces or even the entire external surface of body 5, as in the examples illustrated in FIGS. 3 and 4. By way of information, coatings 2, 4, 6 are not to scale relative to the dimensions of core 8, in order to show more clearly the location of each part.

It is therefore clear that the body of the invention may, in a non-limiting manner, include a substantially quadrilateral-shaped section, only one face of which is coated or whose faces are in identical pairs or whose faces are entirely coated in an identical or non-identical manner.

Figure 5:
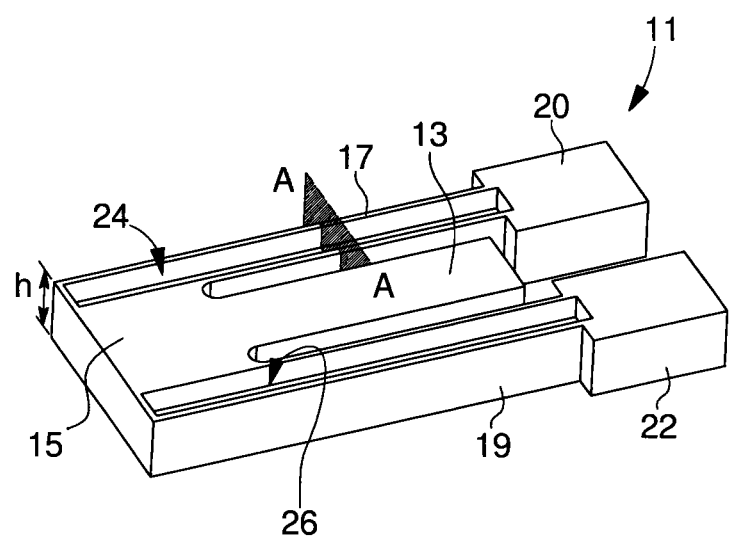
FIG. 5 is a general perspective diagram of a tuning fork resonator.

Similarly, advantageously according to the invention, a tuning fork resonator 11 is shown in FIG. 5. The resonator body 15 is formed of a base 13 connected to two arms 17, 19 intended to oscillate. By way of example, the tuning fork 11 used is of the inverted type, i.e. the base 13 extends between the two flipper arms 17, 19, i.e. the two arms 17, 19 have fillpes 20, 22 at the ends thereof, and of the groove type, i.e. the two arms 17, 19 include grooves 24, 26. It is clear however that there is a multitude of possible tuning fork variants which may, in a non-exhaustive manner, be of the inverted and/or groove and/or conical and/or flipper type.

Figure 6:
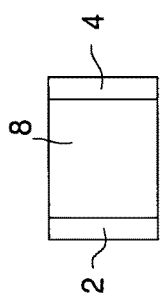
FIGS. 6 and 7 are alternative sections of a resonator according to the invention.
Figure 7:
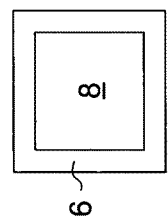

Advantageously according to the invention, tuning fork 11 has first order α and second order β thermal coefficients which are compensated by the deposition of a layer 12, 14, 16 on core 18 of body 15. FIGS. 6 and 7 propose two non-exhaustive example cross-sections of body 15 of tuning fork 11 along plane A-A. The grooved quadrilateral sections show core 18 of body 15 coated with at least one coating 12, 14, 16 on at least one part, such as one or more faces, or even the entire external surface of body 15. As in the first example, coatings 12, 14, 16 are not to scale relative to the dimensions of core 18, in order to show more clearly the location of each part.

Core 8, 18 of resonator 1, 11 is formed of ceramic. However, there is a huge variety of ceramics. This is why ceramics which have low thermal elastic coefficient (TEC) and low expansion coefficient ($\alpha_{spi}$) are preferred.

It is therefore possible to use quartz glass, also known as fused quartz. Contrary to what the use of the word "quartz" might suggest, this is not a crystalline material, but an amorphous silica.

Depending on the method for manufacturing fused quartz, the thermal elastic coefficient (TEC) obtained is generally low and positive, i.e. comprised between 50 and 250 ppm. ° $C.^{-1}$. Further, the expansion coefficient $\alpha_{spi}$ of fused quartz is around 0.5.ppm. ° $C.^{-1}$, which is very low. For the fused quartz example, this means that coating 2, 4, 6, 12, 14, 16 preferably has a thermal elastic coefficient (TEC) which is negative. As explained above, this coating may thus include a metal or metallic alloy or another ceramic such as silicon carbide.

Of course, it is perfectly possible to envisage other glasses from the family of alkaline silicates, borosilicates or aluminosilicates.

| TEC (ppm. ° $C.^{-1}$) | Material |
|---|---|
| −209 | Soda glass |
| −35 | Sibor glass |
| −48 | Borosilicate (a) |
| +117 | Borosilicate (b) |
| −18 | Aluminosilicate (a) |
| −70 | Aluminosilicate (b) |

By way of example, PYREX® or SCHOTT® BF33, AF45 glasses may be used:

|  | BF33 | AF45 |
|---|---|---|
| $SiO_2$ | 81 | 50 |
| $B_2O_3$ | 13 | 14 |
| $Al_2O_3$ | 2 | 11 |
| BaO |  | 24 |
| $Na_2O$—$K_2O$ | 4 |  |
| $\alpha_{spi}$ (ppm. ° $C.^{-1}$) | 3.25 | 4.5 |
| TEC (ppm. ° $C.^{-1}$) | >0 | >0 | where:

$\alpha_{spi}$ is the expansion coefficient of the material (ppm. ° C.$^{-1}$);

TEC is the thermal elastic coefficient (ppm. ° C.$^{-1}$).

Photostructurable glasses like those disclosed in WO 2007/059876 (incorporated by reference in this Patent Application) may also be envisaged. Indeed, the photolithographic manufacturing method is very precise for the thermal elastic coefficient (TEC) adjustment. Finally, ceramic glasses, such as for example Zerodur (lithium aluminosilicate ceramic glass), may also be envisaged.

As explained above, it is clear that ceramics may have positive or negative first order and second order thermal elastic coefficients (TEC). This is why the coating(s) 2, 4, 6, 12, 14, 16 used for core 8, 18 may incidentally include either positive or negative first order and second order thermal elastic coefficients (TEC). It is thus clear that resonator 1, 11 can be formed, for example, by a ceramic core totally or partially coated with a coating that is also made of ceramic.

Thus, depending on the deposition method of coating 2, 4, 6, 12, 14, 16, it may be preferable to select a material having good adherence relative to ceramic such as chromium or titanium. However, as an alternative, a primer layer such as chromium or titanium may also be deposited prior to the main coating 2, 4, 6, 12, 14, 16 to improve the adherence and or permeability of said coating.

Finally, in the case where core 8, 18 includes a negative first order or second order thermal elastic coefficient (TEC), preferably germanium oxide (GeO$_2$), tantalum oxide (Ta$_2$O$_5$) and/or zirconium or hafnium oxides may be used as coatings.

Examples were sought for a 4 Hz resonator with a balance wheel having an inertia of 16 mg·cm$^2$. The expansion coefficient of the balance $\beta_{bal}$ affects the thermal dependence of the resonator frequency.

For the balance spring, the height h and length l of the coils are fixed, only their thickness e is adjusted to obtain the right torque. The thickness d of the coating, assumed to coat all the faces of the coils, is adjusted so that there is at least first order α thermal compensation of the resonator frequency.

The properties of the materials used for the core or the coating of the balance spring are summarized in the table below:

|  | E (Gpa) | TEC (ppm. °C.$^{-1}$) | $\alpha_{spi}$ (ppm. °C.$^{-1}$) |
| --- | --- | --- | --- |
| Zerodur | 90 | 76 | 0.0 |
| Al | 68 | −430 | 24.0 |
| CVD-SiC | 466 | −50 | 2.2 |
| 6H-SiC | 220 | −12 | 2.8 |
| SiO$_2$ | 72 | 215 | 0.4 |
| Metallic glass | 117 | −160 | 12.0 |
| TeO$_2$ | 51 | 40,000 | 15.5 |

A first example consists in coating with a metal (here a layer of Al) a Zerodur balance spring sold by SCHOTT® with a substantially zero expansion coefficient.

This glass could also be coated by a layer of SiC deposited by chemical vapour phase deposition (CVD). CVD-SiC is a polycrystalline material considered to be mechanically and chemically resistant. SiC also exists in crystalline form, for example hexagonal, under the name 6H-SiC. The properties of the latter differ from those of polycrystalline shape. In the example below, this is compensated by SiO2.

Finally, a last example is taken from a metallic glass compensated by a layer of TeO$_2$.

A table summarizes the different examples:

| Core | Coating | $\alpha_{bal}$ (ppm. ° C.$^{-1}$) | e (µm) |
| --- | --- | --- | --- |
| Zerodur | Al | 10 | 1.15 |
| Zerodur | CVD-SiC | 15 | 0.79 |
| 6H-SiC | SiO$_2$ | 10 | 1.77 |
| Metallic glass | TeO$_2$ | 15 | 0.06 |

The invention claimed is:

1. A temperature-compensated resonator comprising:
a body used in deformation, a core of the body being formed of fused quartz,
wherein at least one part of the body includes a coating whose Young's modulus variation with temperature is of an opposite sign to that of the fused quartz used for the core, and
the coating is a single coating including a thickness calculated based on a size and a sign of the Young's modulus variation with temperature of the coating, the thickness of the single coating is calculated to include values that affect at least both first and second orders of a frequency variation with temperature of the resonator, and at least the first and second orders of the frequency variation with temperature of the resonator are compensated to be substantially zero based on only the thickness of the single coating that is calculated.

2. The resonator according to claim 1 wherein the coating includes a metal, a metallic alloy, or silicon carbide.

3. The resonator according to claim 1, wherein the coating includes chromium or titanium.

4. The resonator according to claim 1, wherein the body has a substantially quadrilateral-shaped section whose faces are in identical pairs.

5. The resonator according to claim 1, wherein the body includes a substantially quadrilateral-shaped section whose faces are entirely coated.

6. The resonator according to claim 1, wherein the body is a bar wound around itself to form a balance spring and is coupled to an inertia fly-wheel.

7. The resonator according to claim 1, wherein the body includes at least two symmetrically mounted bars to form a tuning fork.

8. The resonator according to claim 1, wherein the body is a MEMS resonator.

9. The resonator according to claim 1, wherein the coating is electrically conductive.

10. The resonator according to claim 1, wherein the coating includes a positive Young's modulus variation with temperature for the first order frequency variation with temperature of the resonator and for the second order frequency variation with temperature of the resonator.

11. The resonator according to claim 1, wherein the coating includes a negative Young's modulus variation with temperature for the first order frequency variation with temperature of the resonator and for the second order frequency variation with temperature of the resonator.

12. The resonator according to claim 1, wherein the coating is a sole coating on the core of the body.

13. The resonator according to claim 1, wherein the frequency variation with temperature of the resonator follows a relationship:

$$\frac{\Delta f}{f_0} = A + \alpha \cdot (T - T_0) + \beta \cdot (T - T_0)^2 + \gamma \cdot (T - T_0)^3$$

where:

$$\frac{\Delta f}{f_0}$$

is a relative frequency variation,
A is a constant which depends upon a point of reference,
$T_0$ is a reference temperature,
α is a first order thermal coefficient,
β is a second order thermal coefficient, and
γ is a third order thermal coefficient.

14. A temperature-compensated resonator comprising:
a body used in deformation, a core of the body being formed of a borosilicate glass or an aluminosilicate glass,
wherein at least one part of the body includes a coating whose Young's modulus variation with temperature is of an opposite sign to that of the borosilicate glass or the aluminosilicate glass used for the core, and
the coating is a single coating including a thickness calculated based on a size and a sign of the Young's modulus variation with temperature of the coating, the thickness of the single coating is calculated to include values that affect at least both first and second orders of a frequency variation with temperature of the resonator, and at least the first and second orders of the frequency variation with temperature of the resonator are substantially zero based on only the thickness of the single coating that is calculated.

15. A temperature-compensated resonator comprising:
a body used in deformation, a core of the body being formed of a photostructurable glass,
wherein at least one part of the body includes a coating whose Young's modulus variation with temperature is of an opposite sign to that of the photostructurable glass used for the core, and
the coating is a single coating including a thickness calculated based on a size and a sign of the Young's modulus variation with temperature of the coating, the thickness of the single coating is calculated to include values that affect at least both first and second orders of a frequency variation with temperature of the resonator, and at least the first and second orders of the frequency variation with temperature of the resonator are substantially zero based on only the thickness of the single coating that is calculated.

16. A temperature-compensated resonator comprising:
a body used in deformation, a core of the body being formed of ceramic glass,
wherein at least one part of the body includes a coating whose Young's modulus variation with temperature is of an opposite sign to that of the ceramic glass used for the core, and
the coating is a single coating including a thickness calculated based on a size and a sign of the Young's modulus variation with temperature of the coating, the thickness of the single coating is calculated to include values that affect at least both first and second orders of a frequency variation with temperature of the resonator, and at least the first and second orders of the frequency variation with temperature of the resonator are substantially zero based on only the thickness of the single coating that is calculated.

17. The resonator according to claim 16, wherein the core of the body is formed of lithium aluminosilicate ceramic glass.

18. The resonator according to claim 17, wherein the coating includes a metal or silicon carbide.

19. The resonator according to claim 16, wherein the coating includes chromium, aluminium, or titanium.

20. The resonator according to claim 16, wherein the body has a substantially quadrilateral-shaped section whose faces are in identical pairs.

21. The resonator according to claim 16, wherein the body includes a substantially quadrilateral-shaped section whose faces are entirely coated.

22. The resonator according to claim 16, wherein the body is a bar wound around itself to form a balance spring and is coupled to an inertia fly-wheel.

23. The resonator according to claim 16, wherein the body includes at least two symmetrically mounted bars to form a tuning fork.

24. The resonator according to claim 16, wherein the body is a MEMS resonator.

25. A temperature-compensated resonator comprising:
a body used in deformation, a core of the body being formed of technical ceramic,
wherein at least one part of the body includes a coating whose Young's modulus variation with temperature is of an opposite sign to that of the technical ceramic used for the core, and
the coating is a single coating including a thickness calculated based on a size and a sign of the Young's modulus variation with temperature of the coating, the thickness of the single coating is calculated to include values that affect at least both first and second orders of a frequency variation with temperature of the resonator, and at least the first and second orders of the frequency variation with temperature of the resonator are substantially zero based on only the thickness of the single coating that is calculated.

26. The resonator according to claim 25, wherein the core of the body is formed of silicon carbide in crystalline form.

27. The resonator according to claim 26, wherein the coating includes silicon dioxide.

28. The resonator according to claim 25, wherein the coating includes chromium or titanium.

29. The resonator according to claim 25, wherein the body has a substantially quadrilateral-shaped section whose faces are in identical pairs.

30. The resonator according to claim 25, wherein the body includes a substantially quadrilateral-shaped section whose faces are entirely coated.

31. The resonator according to claim 25, wherein the body is a bar wound around itself to form a balance spring and is coupled to an inertia fly-wheel.

32. The resonator according to claim 25, wherein the body includes at least two symmetrically mounted bars to form a tuning fork.

33. The resonator according to claim 25, wherein the body is a MEMS resonator.

34. A temperature-compensated resonator comprising:
a body used in deformation, a core of the body being formed of metallic glass, wherein at least one part of the body includes a coating whose Young's modulus variation with temperature is of an opposite sign to that of the metallic glass used for the core, and the coating is a single coating including a thickness calculated based on a size and a sign of the Young's modulus variation with temperature of the coating, the thickness of the single coating is calculated to include values that affect at least both first and second orders of a frequency variation with temperature of the resonator, and at least the first and second orders of the frequency variation with temperature of the resonator are substantially zero based on only the thickness of the single coating that is calculated.

35. The resonator according to claim 34, wherein the coating includes tellurium dioxide.

36. The resonator according to claim 34, wherein the coating includes chromium or titanium.

37. The resonator according to claim 34, wherein the body has a substantially quadrilateral-shaped section whose faces are in identical pairs.

38. The resonator according to claim 34, wherein the body includes a substantially quadrilateral-shaped section whose faces are entirely coated.

39. The resonator according to claim 34, wherein the body is a bar wound around itself to form a balance spring and is coupled to an inertia fly-wheel.

40. The resonator according to claim 34, wherein the body includes at least two symmetrically mounted bars to form a tuning fork.

41. The resonator according to claim 34, wherein the body is a MEMS resonator.

* * * * *